(12) United States Patent
Obiya et al.

(10) Patent No.: US 10,103,706 B2
(45) Date of Patent: Oct. 16, 2018

(54) TRANSMISSION AND RECEPTION DEVICE

(71) Applicant: Murata Manufacturing Co., Ltd., Kyoto (JP)

(72) Inventors: Hidenori Obiya, Kyoto (JP); Atsushi Horita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 48 days.

(21) Appl. No.: 15/274,165

(22) Filed: Sep. 23, 2016

(65) Prior Publication Data

US 2017/0012600 A1    Jan. 12, 2017

Related U.S. Application Data

(63) Continuation of application No. PCT/JP2015/053467, filed on Feb. 9, 2015.

(30) Foreign Application Priority Data

Mar. 24, 2014   (JP) .................. 2014-059389

(51) Int. Cl.
*H03H 7/40* (2006.01)
*H04B 1/04* (2006.01)
(Continued)

(52) U.S. Cl.
CPC ............ *H03H 7/40* (2013.01); *H03H 7/0138* (2013.01); *H03H 7/463* (2013.01); *H04B 1/0458* (2013.01);
(Continued)

(58) Field of Classification Search
None
See application file for complete search history.

(56) References Cited

U.S. PATENT DOCUMENTS 8,208,865 B2   6/2012  Mikhemar et al.
2005/0042989 A1* 2/2005 Ho .................. H04B 1/0458
455/78
(Continued)

FOREIGN PATENT DOCUMENTS

| JP | 2013-038613 A | 2/2013 |
| JP | 2014-003460 A | 1/2014 |
| WO | 2013-149227 A1 | 10/2013 |

OTHER PUBLICATIONS

International Search Report issued in Japanese Patent Application No. PCT/JP2015/053467 dated Apr. 7, 2015.

(Continued)

*Primary Examiner* — Kodzovi Acolatse
(74) *Attorney, Agent, or Firm* — Pearne and Gordon LLP

(57) ABSTRACT

A transmission and reception device includes a control unit, an antenna duplexer, a transmission circuit, a reception circuit, a detection unit, an antenna matching circuit, and a load adjustment circuit. The detection unit is connected to an antenna side of the antenna duplexer. The detection unit detects a reflection signal generated as a transmission signal is reflected by the antenna. The control unit adjusts element values of a capacitor a resistance constituting the load adjustment circuit on the basis of the detected reflection signal. The load adjustment circuit is connected to the antenna duplexer. By adjusting the element value of the load adjustment circuit, the impedance of the antenna duplexer is adjusted and the impedance between the antenna and the antenna duplexer is matched.

11 Claims, 6 Drawing Sheets

(51) Int. Cl.
*H04B 1/18* (2006.01)
*H03H 7/01* (2006.01)
*H04L 5/14* (2006.01)
*H03H 7/46* (2006.01)

(52) U.S. Cl.
CPC ................. *H04B 1/18* (2013.01); *H04L 5/14* (2013.01); *H03H 7/46* (2013.01)

(56) References Cited

U.S. PATENT DOCUMENTS

| | | | | |
|---|---|---|---|---|
| 2005/0181784 A1* | 8/2005 | Ho | ........................ | G01S 7/4017 |
| | | | | 455/425 |
| 2007/0190954 A1* | 8/2007 | Murakami | ............... | H03H 7/38 |
| | | | | 455/132 |
| 2014/0315592 A1* | 10/2014 | Schlub | ................. | H04B 1/3838 |
| | | | | 455/522 |

OTHER PUBLICATIONS

Written Opinion issued in Japanese Patent Application No. PCT/JP2015/053467 dated Apr. 7, 2015.

* cited by examiner

TRANSMISSION AND RECEPTION DEVICE

This is a continuation of International Application No. PCT/JP2015/053467 filed on Feb. 9, 2015 which claims priority from Japanese Patent Application No. 2014-059389 filed on Mar. 24, 2014. The contents of these applications are incorporated herein by reference in their entireties.

BACKGROUND

Technical Field

The present disclosure relates to transmission and reception devices that transmit and receive high-frequency signals in different frequency bands with the use of a single antenna.

Currently, along with the reduction in the size of communication devices, various configurations for transmitting and receiving a plurality of types of high-frequency signals in different frequency bands with the use of a single antenna are designed. For example, according to Patent Documents 1 and 2, a transmission circuit and a reception circuit are connected to an antenna with an antenna duplexer interposed therebetween. The antenna duplexer transmits a high-frequency signal (transmission signal) from the transmission circuit to the antenna and transmits a high-frequency signal (reception signal) from the antenna to the reception circuit.

In addition, the transmission and reception device described in Patent Documents 1 and 2 is provided with an adjustment circuit that adjusts the characteristics of the antenna duplexer in order not only to transmit and receive a set of a transmission signal and a reception signal but also to transmit and receive a transmission signal and a reception signal that are in another frequency band. The characteristics of the antenna duplexer are adjusted by changing the element value of the adjustment circuit, and transmission of transmission signals having various frequencies and reception of reception signals having various frequencies are achieved.

Patent Document 1: U.S. Pat. No. 8,208,865
Patent Document 2: International Publication No. 2013/149227

BRIEF SUMMARY

However, in a mobile device, an antenna impedance may vary depending on the transmission and reception environment (e.g., a mode in which an operator carries the mobile device, the electromagnetic environment surrounding the mobile device, etc.). When a transmission signal is reflected by an antenna due to such a variation of the antenna impedance, a reflection signal is input to an antenna duplexer from the antenna side.

As indicated in Patent Documents 1 and 2, when an antenna duplexer is implemented by a circuit configuration that uses coupling of inductors, the isolation is low as compared to a case in which a duplexer is used as an antenna duplexer, and a reflection signal of an antenna leaks into the reception circuit side, which may cause a deterioration in the reception sensitivity or damage to the reception circuit. In addition, a reflection signal leaks into the transmission circuit side, which may cause a deterioration in the transmission characteristics or damage to the transmission circuit.

Accordingly, the present disclosure is directed to providing a transmission and reception device that can maintain good transmission and reception characteristics even when the transmission and reception environment changes.

A transmission and reception device according to the present disclosure includes an antenna duplexer, a load adjustment circuit, and a control unit. The antenna duplexer outputs, to an antenna terminal, a high-frequency signal that has been input through a transmission signal input terminal and outputs, to a reception signal output terminal, a high-frequency signal that has been input through the antenna terminal by using a plurality of inductors that couple to each other. The load adjustment circuit is connected to the antenna duplexer and includes a variable circuit element. The control unit detects a variation in an impedance of an antenna to which the antenna terminal is connected and controls a circuit element value of the load adjustment circuit.

According to this configuration, the element value of the variable circuit element constituting the load adjustment circuit is adjusted in accordance with a load of the antenna, and the impedance characteristics of the antenna duplexer are adjusted. Accordingly, even when the load of the antenna varies, the impedance characteristics of the antenna duplexer are adjusted in accordance with the variation, and thus a deterioration in the transmission characteristics associated with the variation in the load of the antenna can be suppressed.

In addition, in the transmission and reception device according to the present disclosure, the control unit can include a detection circuit that is connected to the antenna terminal and that detects a high-frequency signal transmitted between the antenna terminal and the antenna, and an adjustment amount determination unit that determines the circuit element value on the basis of the high-frequency signal detected by the detection circuit.

In addition, the transmission and reception device according to the present disclosure can be configured as follows. The control unit further includes an amplitude and phase detection circuit that detects an amplitude and a phase of the high-frequency signal detected by the detection circuit. The adjustment amount determination unit determines the circuit element value on the basis of the amplitude and the phase of the high-frequency signal.

According to this configuration, the impedance of the antenna duplexer can be adjusted with higher accuracy.

In addition, in the transmission and reception device according to the present disclosure, the control unit may include a detection unit that is not connected to the antenna terminal that detects a variation in the impedance of the antenna to which the antenna terminal is connected, and an adjustment amount determination unit that determines the circuit element value on the basis of a high-frequency signal detected by the detection circuit.

According to this configuration, the detection unit is outside the transmission path of the high-frequency signal, and transmission loss of the high-frequency signal by the detection unit can be suppressed.

In addition, the transmission and reception device according to the present disclosure can include at least one of a transmission side filter that is connected to the transmission signal input terminal, whose pass band contains a frequency band of the transmission signal, and whose attenuation band contains a frequency band of the reception signal, or a reception side filter that is connected to the reception signal output terminal, whose pass band contains the frequency band of the reception signal, and whose attenuation band contains the frequency band of the transmission signal.

According to this configuration, unnecessary transmission of a signal other than a signal in a fundamental frequency band can be suppressed.

In addition, in the transmission and reception device according to the present disclosure, at least one of the transmission side filter and the reception side filter be a frequency variable filter.

According to this configuration, unnecessary transmission of a signal other than a signal in a fundamental frequency band in a plurality of frequency bands can be suppressed.

According to the present disclosure, good transmission and reception characteristics can be maintained even when the transmission and reception environment changes.

DETAILED DESCRIPTION

Figure 1:
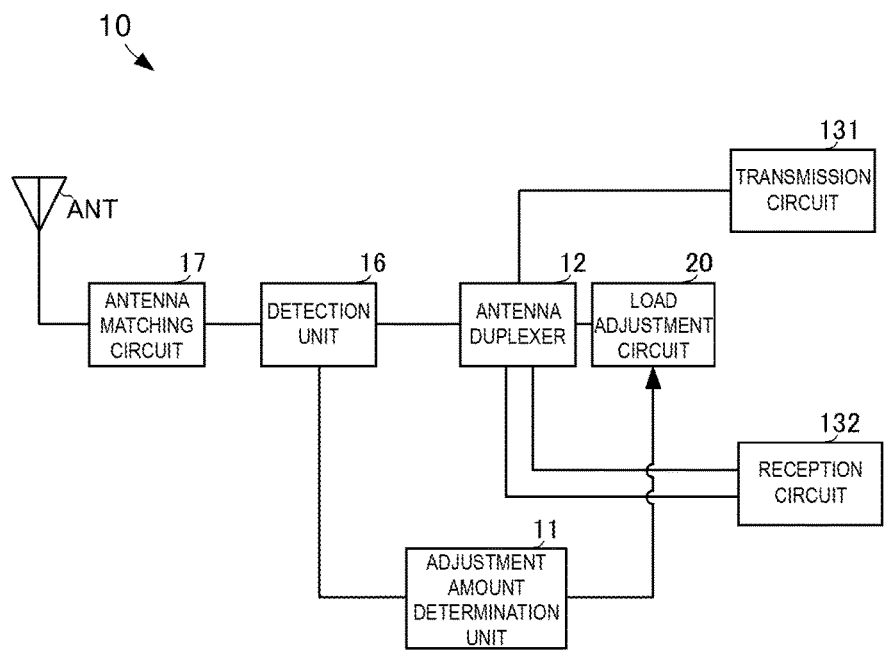
FIG. 1 is a circuit block diagram of a transmission and reception device according to a first embodiment of the present disclosure.
Figure 2A:
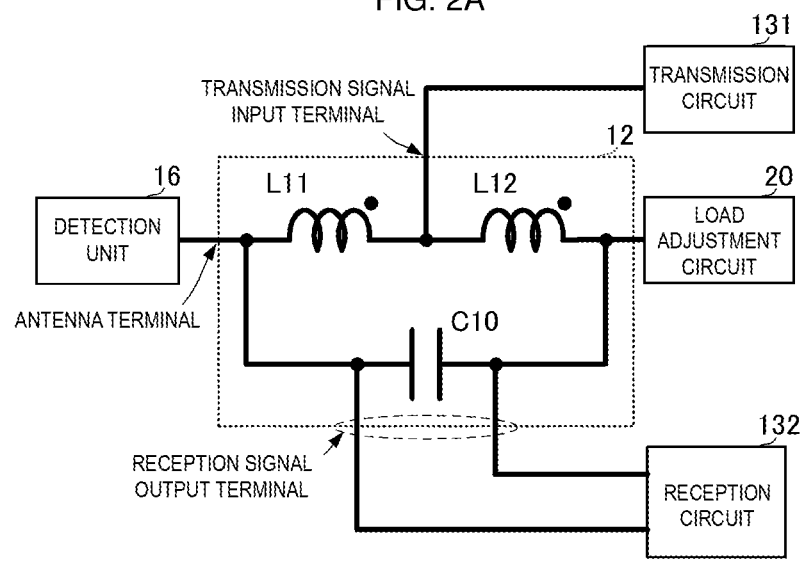
FIGS. 2A and 2B illustrate a circuit diagram of an antenna duplexer and a circuit diagram of a load adjustment circuit according to the first embodiment of the present disclosure.
Figure 2B:
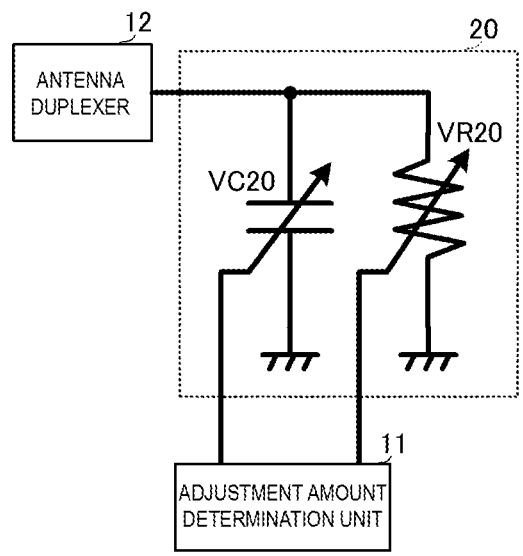

A transmission and reception device according to a first embodiment of the present disclosure will be described with reference to the drawings. FIG. 1 is a circuit block diagram of the transmission and reception device according to the first embodiment of the present disclosure. FIG. 2A is a circuit diagram of an antenna duplexer according to the first embodiment of the present disclosure. FIG. 2B is a circuit diagram of a load adjustment circuit according to the first embodiment of the present disclosure.

A transmission and reception device 10 includes an adjustment amount determination unit 11, an antenna duplexer 12, a transmission circuit 131, a reception circuit 132, a detection unit 16, an antenna matching circuit 17, and a load adjustment circuit 20. The adjustment amount determination unit 11 and the detection unit 16 constitute a control unit of the present disclosure.

The antenna duplexer 12 includes a transmission signal input terminal, a reception signal output terminal, and an antenna terminal. Specifically, as illustrated in FIG. 2A, the antenna duplexer 12 includes inductors L11 and L12 and a capacitor C10. One terminal of the inductor L11 and another terminal of the inductor L12 are connected to each other, and a node between the inductors L11 and L12 is connected to the transmission signal input terminal. Another terminal of the inductor L11 is connected to the antenna terminal and one terminal of the reception signal output terminal of a balanced type. One terminal of the inductor L12 is connected to another terminal of the reception signal output terminal of a balanced type and the load adjustment circuit 20. The capacitor C10 is connected between the one terminal and the other terminal of the reception signal output terminal of a balanced type. The inductors L11 and L12 have the same inductance.

The antenna duplexer 12 outputs, through the antenna terminal, a transmission signal (high-frequency signal) having a desired frequency that has been input to the transmission signal input terminal by using the coupling between the inductors L11 and L12. In addition, the antenna duplexer 12 outputs, through the reception signal output terminal, a reception signal (high-frequency signal) having a desired frequency that has been input to the antenna terminal. The capacitor C10 is used mainly to control the phase of the reception signal.

As illustrated in FIG. 2B, the load adjustment circuit 20 includes a variable capacitor VC20 and a variable resistance VR20. The variable capacitor VC20 and the variable resistance VR20 are connected in parallel between a node at which the load adjustment circuit 20 connects to the antenna duplexer 12 and the ground. The element values (the capacitance and the resistance value) of the variable capacitor VC20 and of the variable resistance VR20 are changed on the basis of the adjustment amounts of the element values from the adjustment amount determination unit 11.

The transmission circuit 131 is connected to the transmission signal input terminal of the antenna duplexer 12. The transmission circuit 131 includes, for example, a transmission signal generation circuit and a power amplifier.

The reception circuit 132 is connected to the reception signal output terminal of the antenna duplexer 12. The reception circuit 312 includes, for example, a low-noise amplifier and a demodulation circuit.

The detection unit 16 is connected to the antenna terminal of the antenna duplexer 12, and the antenna matching circuit 17 is connected to the detection unit 16. An antenna ANT is connected to the antenna matching circuit 17. In other words, the antenna terminal of the antenna duplexer 12 is connected to the antenna ANT with the detection unit 16 and the antenna matching circuit 17 interposed therebetween. It is to be noted that the detection unit 16 may be connected between the antenna matching circuit 17 and the antenna ANT.

The detection unit 16 detects a load of the antenna ANT. The detection unit 16 includes, for example, a directional coupler and detects a reflection signal transmitted between the antenna terminal and the antenna ANT. The detection unit 16 outputs the detected reflection signal to the adjustment amount determination unit 11.

The antenna matching circuit 17 carries out impedance matching between the antenna ANT and the antenna duplexer 12. The antenna matching circuit 17 can be an impedance matching circuit of an impedance variable type. Basically, the impedance matching between the antenna ANT and the transmission circuit 131 and reception circuit 132 is achieved by the antenna matching circuit 17.

The adjustment amount determination unit 11 detects the variation in the antenna impedance on the basis of the power of the reflection signal detected by the detection unit 16, and determines the adjustment amount of each element value (the capacitance, the resistance value) of the load adjustment circuit 20 on the basis of the detected variation in the antenna impedance. This adjustment amount is determined so that impedance mismatching generated between the antenna ANT and the antenna duplexing circuit 12 due to the variation in the antenna impedance is corrected and the impedance matching between the antenna ANT and the antenna duplexing circuit 12 is achieved.

The adjustment amount determination unit 11 carries out control of providing the determined adjustment amount of the element value to the load adjustment circuit 20. The load adjustment circuit 20 changes the element value on the basis of this adjustment amount.

Figure 3:
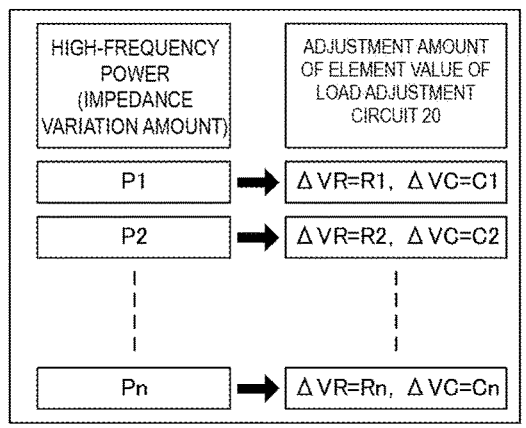
FIG. 3 illustrates an example of a table for determining an element value executed by an adjustment amount determination unit of the transmission and reception device according to the first embodiment of the present disclosure.

FIG. 3 illustrates an example of a table for determining the element value executed by the adjustment amount determination unit of the transmission and reception device according to the first embodiment of the present disclosure.

The adjustment amount determination unit 11 has the signal level of the reflection signal detected by the detection unit 16, or in other words, high-frequency power P (corresponding to the reflection power) and the element value adjustment amounts (ΔVR, ΔVC) stored therein in advance. With the use of the table illustrated in FIG. 3, the adjustment amount determination unit 11 reads out the element value adjustment amounts (ΔVR, ΔVC) corresponding to the detected high-frequency power P. For example, the adjustment amount determination unit 11 reads out the element value adjustment amounts ΔNR=R1 and ΔNC=C1 if the high-frequency power is P1. If the high-frequency power is Pn, the adjustment amount determination unit 11 reads out the element value adjustment amounts ΔNR=Rn and ΔNC=Cn.

The adjustment amount determination unit 11 provides the read-out element value adjustment amounts (ΔNR, ΔNC) to the load adjustment circuit 20. It is to be noted that, at this point, the adjustment amount determination unit 11 may have the element value of the load adjustment circuit 20 stored therein, calculate the adjusted element value obtained by correcting the element value of the load adjustment circuit 20 by the read-out element value adjustment amounts (ΔNR, ΔNC), and provide the adjusted element value to the load adjustment circuit 20.

By adjusting the element value of the load adjustment circuit 20 in this manner, even when the impedance of the antenna varies, the impedance between the antenna terminal of the antenna duplexer 12 and the antenna ANT can be matched in accordance with the variation. Thus, low-loss transmission and reception can be achieved even when the impedance of the antenna varies, and good transmission and reception characteristics can be maintained.

Figure 4:
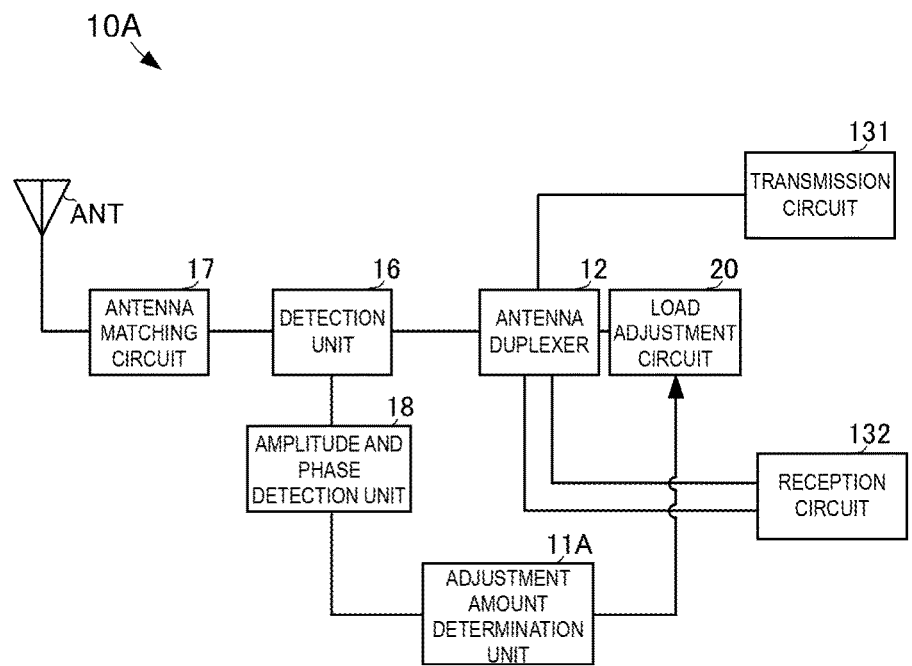
FIG. 4 is a circuit block diagram of a transmission and reception device according to a second embodiment of the present disclosure.

Next, a transmission and reception device according to a second embodiment of the present disclosure will be described with reference to the drawings. FIG. 4 is a circuit block diagram of the transmission and reception device according to the second embodiment of the present disclosure. The transmission and reception device according to the present embodiment is obtained by adding an amplitude and phase detection unit 18 to the transmission and reception device according to the first embodiment. Other configurations are the same as those of the transmission and reception device according to the first embodiment.

The amplitude and phase detection unit 18 detects the amplitude and the phase of a high-frequency signal output from the detection unit 16. At this point, by constituting the detection unit 16 by a bidirectional coupler, the amplitude and the phase of the transmission signal and of the reflection signal can be detected. The amplitude and phase detection unit 18 outputs the detected amplitude and phase to an adjustment amount determination unit 11A.

The adjustment amount determination unit 11A determines the adjustment amount of each element value (the capacitance, the resistance value) of the load adjustment circuit 20 on the basis of the detection result of the amplitude and the phase from the amplitude and phase detection unit 18.

Figure 5:
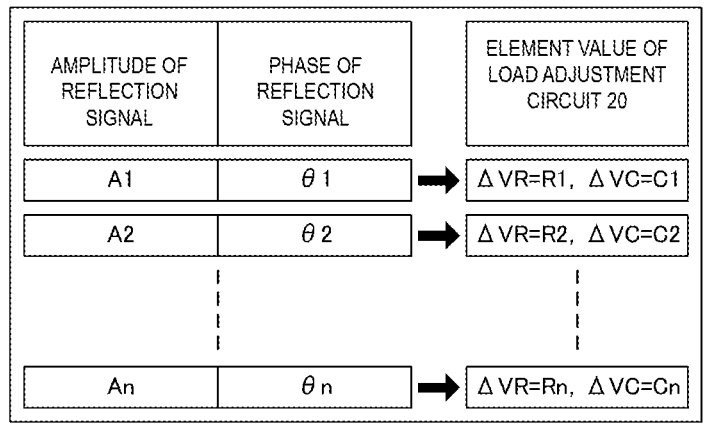
FIG. 5 illustrates an example of a table for determining an element value executed by an adjustment amount determination unit of the transmission and reception device according to the second embodiment of the present disclosure.

FIG. 5 illustrates an example of a table for determining the element value executed by the adjustment amount determination unit of the transmission and reception device according to the second embodiment of the present disclosure. It is to be noted that a mode in which the element value is determined from the amplitude and the phase of the reflection signal will be described hereinafter.

The adjustment amount determination unit 11A has the amplitude A and the phase θ of the reflection signal detected by the amplitude and phase detection unit 18 and the element value adjustment amounts (ΔVR, ΔVC) stored therein in advance. With the use of the table illustrated in FIG. 5, the adjustment amount determination unit 11A reads out the element value adjustment amounts (ΔVR, ΔVC) corresponding to the detected amplitude A and phase θ. For example, the adjustment amount determination unit 11A reads out the element value adjustment amounts ΔVR=R1 and ΔVC=C1 if the amplitude is A1 and the phase is θ1. If the amplitude is An and the phase is θn, the adjustment amount determination unit 11A reads out the element value adjustment amounts ΔVR=Rn and ΔVC=Cn.

The adjustment amount determination unit 11A provides the read-out element value adjustment amounts (ΔVR, ΔVC) to the load adjustment circuit 20.

With such a configuration, the element value of the load adjustment circuit 20 can be adjusted with higher accuracy. Thus, lower-loss transmission and reception can be achieved even when the impedance of the antenna varies, and good transmission and reception characteristics can be maintained with higher reliability.

Figure 6:
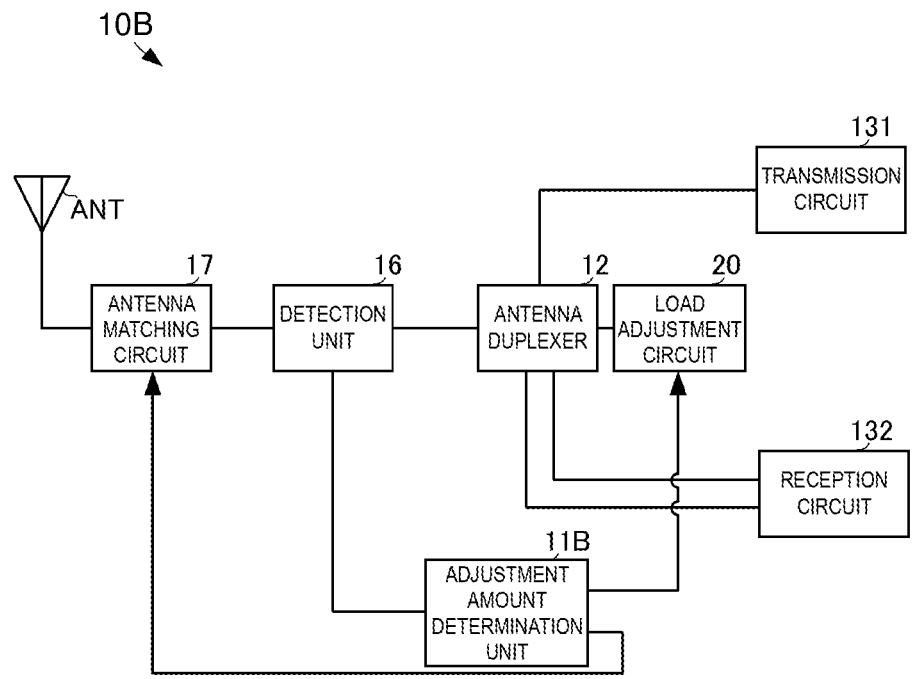
FIG. 6 is a circuit block diagram of a transmission and reception device according to a third embodiment of the present disclosure.

Next, a transmission and reception device according to a third embodiment of the present disclosure will be described with reference to the drawings. FIG. 6 is a circuit block diagram of the transmission and reception device according to the third embodiment of the present disclosure.

A transmission and reception device 10B according to the present embodiment differs from the transmission and reception device 10 according to the first embodiment in terms of the control of an adjustment amount determination unit 11B. Other configurations are the same as those of the transmission and reception device according to the first embodiment.

The adjustment amount determination unit 11B controls the element value of the load adjustment circuit 20 and controls the element value of the antenna matching circuit 17 on the basis of the detection result of the determined reflection signal. With such a configuration, reflection of the transmission signal at the antenna ANT can be further suppressed.

Figure 7:
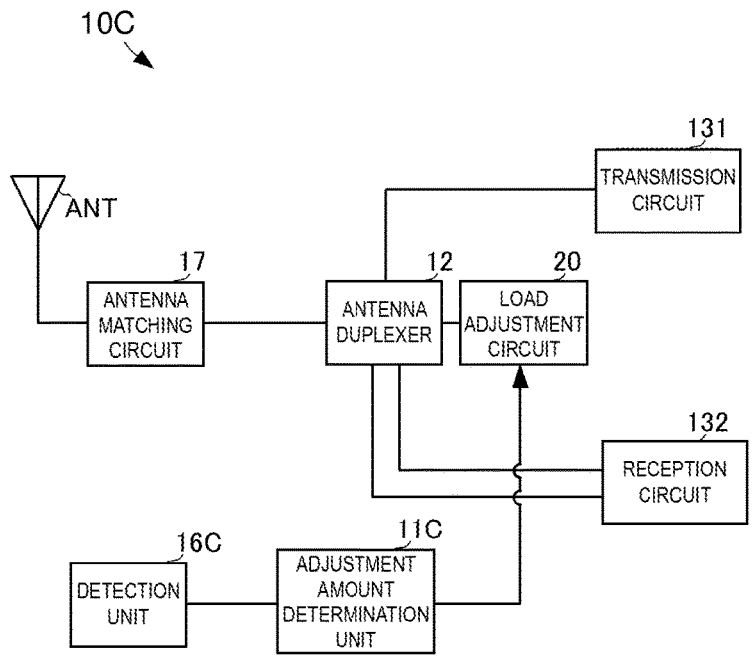
FIG. 7 is a circuit block diagram of a transmission and reception device according to a fourth embodiment of the present disclosure.

Next, a transmission and reception device according to a fourth embodiment of the present disclosure will be described with reference to the drawings. FIG. 7 is a circuit block diagram of the transmission and reception device according to the fourth embodiment of the present disclosure.

A transmission and reception device 10C according to the present embodiment differs from the transmission and reception device 10 according to the first embodiment in terms of the configuration of a detection unit 16C. Other configurations are the same as those of the transmission and reception device according to the first embodiment.

The detection unit 16C is not connected between the antenna duplexer 12 and the antenna matching circuit 17. In other words, the detection unit 16C is not included in a transmission system of a high-frequency signal.

For such a detection unit 16C, for example, a motion sensor or a proximity sensor may be used. A proximity sensor is a sensor that can detect a terminal provided in the transmission and reception device 10C approaching a wall or the like.

The adjustment amount determination unit 11C estimates the intensity, the amplitude, and the phase of the reflection signal on the basis of the detection result of the detection unit 16C and controls the element value of the load adjustment circuit 20 in the manner illustrated in the above-described embodiments.

With such a configuration as well, effects similar to those of the first embodiment can be obtained. Furthermore, the detection unit 16C is not disposed in the transmission path of the high-frequency signal in the present embodiment, and thus transmission loss associated with the detection unit 16C can be prevented.

Figure 8:
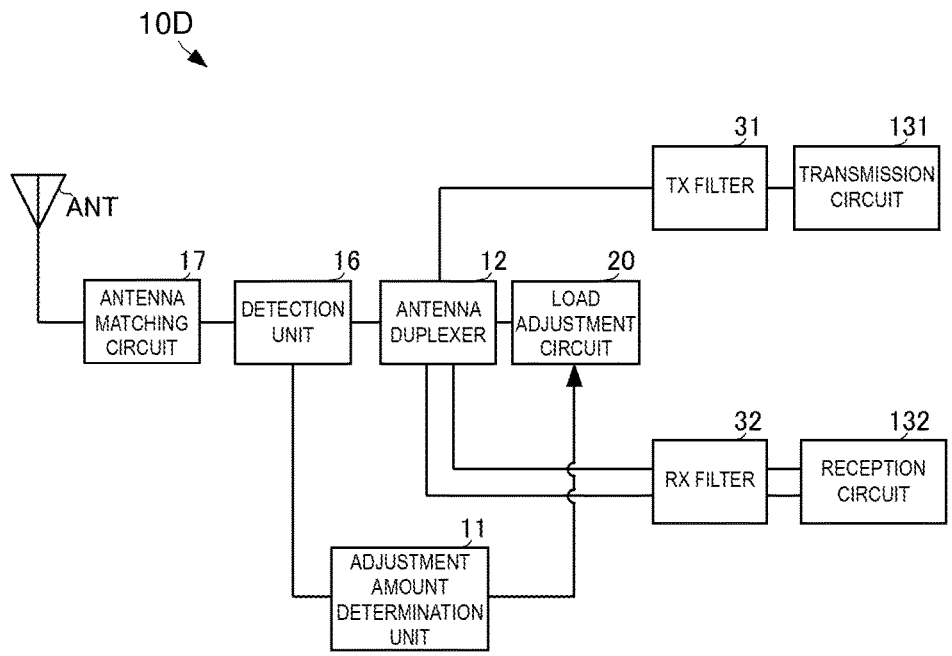
FIG. 8 is a circuit block diagram of a transmission and reception device according to a fifth embodiment of the present disclosure.

Next, a transmission and reception device according to a fifth embodiment of the present disclosure will be described with reference to the drawings. FIG. 8 is a circuit block diagram of the transmission and reception device according to the fifth embodiment of the present disclosure.

A transmission and reception device 10D according to the present embodiment is obtained by adding a TX filter 31 and an RX filter 32 to the transmission and reception device 10 according to the first embodiment. Other configurations are the same as those of the transmission and reception device 10 according to the first embodiment.

The TX filter 31 is connected to the transmission signal input terminal of the antenna duplexer 12 and is connected between the transmission circuit 131 and the antenna duplexer 12. The TX filter 31 is a filter configured such that its pass band contains a fundamental frequency band of the transmission signal output by the transmission circuit 131 and its attenuation band contains a harmonic frequency of the transmission signal and a fundamental frequency band of the reception signal.

The RX filter 32 is connected to the reception signal output terminal of the antenna duplexer 12 and is connected between the antenna duplexer 12 and the reception circuit 132. The RX filter 32 is a filter configured such that its pass band contains a fundamental frequency band of the reception signal output from the antenna duplexer 12 and its attenuation band contains the remaining frequency bands, such as a fundamental frequency band and a harmonic frequency of the transmission signal and a harmonic frequency of the reception signal.

As such TX filter 31 and RX filter 32 are provided, transmission of an unnecessary signal, that is, a signal having a frequency different from that of a transmission signal and a reception signal having a desired frequency (frequency to be transmitted and received by the transmission and reception device 10D) can be suppressed. Thus, the transmission and reception characteristics can be further improved.

Although a mode in which both the TX filter 31 and the RX filter 32 are provided has been illustrated in the present embodiment, a mode in which only the TX filter 31 is provided or a mode in which only the RX filter 32 is provided may also be employed.

Figure 9:
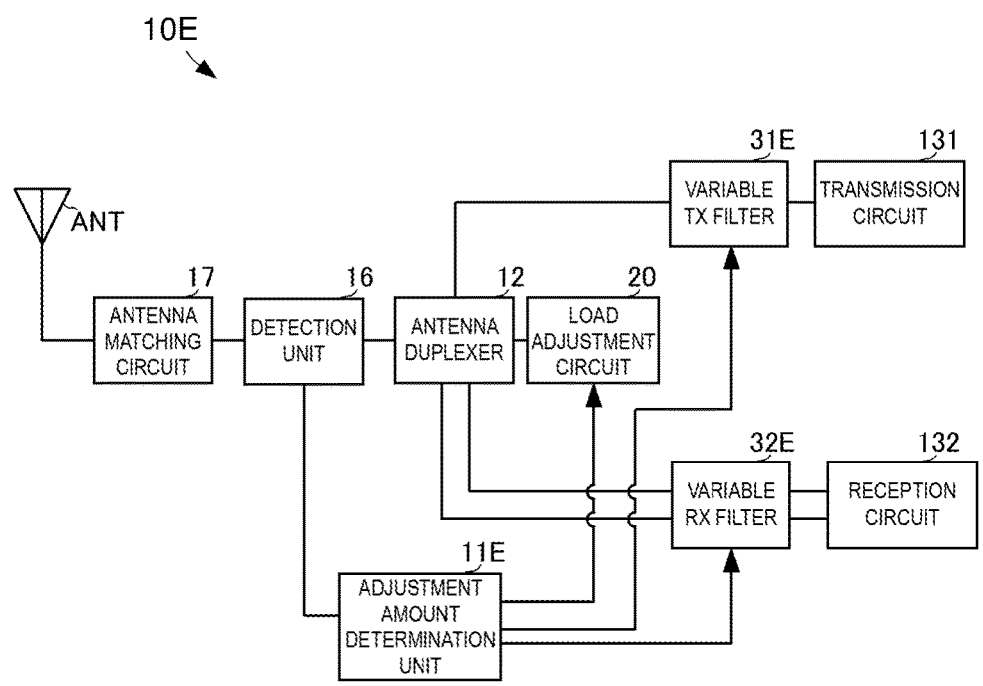
FIG. 9 is a circuit block diagram of a transmission and reception device according to a sixth embodiment of the present disclosure.

Next, a transmission and reception device according to a sixth embodiment of the present disclosure will be described with reference to the drawings. FIG. 9 is a circuit block diagram of the transmission and reception device according to the sixth embodiment of the present disclosure.

A transmission and reception device 10E according to the present embodiment is obtained by replacing the TX filter 31 of the transmission and reception device 10D according to the fifth embodiment with a frequency variable TX filter 31E and replacing the RX filter 32 with a frequency variable RX filter 32E. Other configurations are the same as those of the transmission and reception device 10D according to the fifth embodiment.

For example, for the frequency variable filter, a filter that includes an element, such as a variable capacitor, whose reactance value is variable can be used. In addition, the frequency variable filter may include a plurality of filter units, and a filter unit of a predetermined pass band may be selected by a switching circuit.

In this case, an adjustment amount determination unit 11E can control the element value of the load adjustment circuit 20 as well as the element values of the frequency variable TX filter 31E and the frequency variable RX filter 32E. It is to be noted that the control of the frequency variable TX filter 31E and the frequency variable RX filter 32E by the adjustment amount determination unit 11E can be omitted. In addition, although a mode in which both the frequency variable TX filter 31E and the frequency variable RX filter 32E are provided has been illustrated in the present embodiment, a mode in which only the frequency variable TX filter 31E is provided or a mode in which only the frequency variable RX filter 32E is provided may also be employed. Furthermore, a mode in which the frequency variable TX filter 31E and the RX filter 32 are combined or a mode in which the TX filter 31 and the frequency variable RX filter 32E are combined may be employed.

In this manner, by using the frequency variable filters, even if the transmission signal and the reception signal are in different frequency bands, transmission of an unnecessary signal, that is, a signal having a frequency different from that of the transmission signal and the reception signal having desired frequencies (frequencies to be transmitted and received by the transmission and reception device 10D) can be suppressed.

REFERENCE SIGNS LIST 10, 10A, 10B, 10C, 10D, 10E: TRANSMISSION AND RECEPTION DEVICE
11, 11A, 11B, 11C, 11E: ADJUSTMENT AMOUNT DETERMINATION UNIT
12: ANTENNA DUPLEXER
131: TRANSMISSION CIRCUIT
132: RECEPTION CIRCUIT
16, 16C: DETECTION UNIT
17, 17B: ANTENNA MATCHING CIRCUIT
18: AMPLITUDE AND PHASE DETECTION UNIT
20: LOAD ADJUSTMENT CIRCUIT
31: TX Filter
31E: FREQUENCY VARIABLE TX FILTER
32: RX FILTER
32E: FREQUENCY VARIABLE RX FILTER
ANT: ANTENNA

The invention claimed is:

1. A transmission and reception device, comprising:
an antenna duplexer that outputs, to an antenna terminal, a high-frequency signal that has been input through a transmission signal input terminal and outputs, to a reception signal output terminal, a high-frequency signal that has been input through the antenna terminal, the antenna duplexer comprising a first inductor and a second inductor coupled to each other via a first terminal of the first inductor and a first terminal of the second inductor, and a capacitor connected between a first terminal and a second terminal of the reception signal output terminal;

a load adjustment circuit connected to the antenna duplexer, the load adjustment circuit including a variable circuit element; and a control circuit that detects a variation in an impedance of an antenna connected to the antenna terminal, and controls a value of the variable circuit element in the load adjustment circuit, wherein a second terminal of the first inductor is connected to the antenna terminal and to the first terminal of the reception signal output terminal, and wherein a second terminal of the second inductor is connected to the second terminal of the reception signal output terminal and to the load adjustment circuit.

2. The transmission and reception device according to claim 1, wherein the control circuit includes:
a detection circuit connected to the antenna terminal that detects a high-frequency signal transmitted between the antenna terminal and the antenna, and
an adjustment amount determination circuit that determines the value of the variable circuit element based on the high-frequency signal detected by the detection circuit.

3. The transmission and reception device according to claim 2, wherein the control circuit further includes an amplitude and phase detection circuit that detects an amplitude and a phase of the high-frequency signal detected by the detection circuit, and wherein the adjustment amount determination circuit determines the value of the variable circuit element based on the amplitude and the phase of the high-frequency signal.

4. The transmission and reception device according to claim 1, wherein the control circuit includes:
a detection circuit that is not connected to the antenna terminal and that detects or estimates the variation in the impedance of the antenna to which the antenna terminal is connected, and
an adjustment amount determination circuit that determines the value of the variable circuit element based on the variation in the impedance detected by the detection circuit.

5. The transmission and reception device according to claim 4, wherein the detection circuit detects the variation in the impedance of the antenna with a motion sensor.

6. The transmission and reception device according to claim 4, wherein the detection circuit detects the variation in the impedance of the antenna with a proximity sensor.

7. The transmission and reception device according to claim 1, wherein the transmission and reception device includes at least one of:
a transmission side filter that is connected to the transmission signal input terminal, wherein a pass band of the transmission side filter contains a frequency band of a transmission signal, and wherein an attenuation band of the transmission side filter contains a frequency band of a reception signal, or
a reception side filter that is connected to the reception signal output terminal, wherein a pass band of the reception side filter contains the frequency band of the reception signal, and wherein an attenuation band of the reception side filter contains the frequency band of the transmission signal.

8. The transmission and reception device according to claim 7, wherein at least one of the transmission side filter and the reception side filter is a frequency variable filter.

9. The transmission and reception device according to claim 1, wherein the capacitor controls a phase of a reception signal.

10. The transmission and reception device according to claim 1, further comprising an antenna matching circuit connected between the antenna and the control circuit, the antenna matching circuit matching impedance between the antenna and the antenna duplexer.

11. The transmission and reception device according to claim 2, further comprising an antenna matching circuit connected between the antenna and the control circuit, the antenna matching circuit matching impedance between the antenna and the antenna duplexer, wherein the antenna matching circuit comprises a variable impedance element, the adjustment amount determination circuit determines a value of the variable impedance element based on the high-frequency signal detected by the detection circuit, and the control circuit controls the value of the variable impedance element.

* * * * *

UNITED STATES PATENT AND TRADEMARK OFFICE
CERTIFICATE OF CORRECTION

PATENT NO. : 10,103,706 B2
APPLICATION NO. : 15/274165
DATED : October 16, 2018
INVENTOR(S) : Hidenori Obiya et al.

Page 1 of 1

It is certified that error appears in the above-identified patent and that said Letters Patent is hereby corrected as shown below:

In the Specification

Column 5 Line 28: "$\Delta NR=R1$ and $\Delta NC=C1$" should be --$\Delta VR=R1$ and $\Delta VC=C1$--.
Column 5 Line 31: "$\Delta NR=Rn$" should be --$\Delta VR=Rn$--.
Column 5 Line 32: "$\Delta NC=Cn$" should be --$\Delta VC=Cn$--.
Column 5 Line 34: "$(\Delta NR, \Delta NC)$" should be --$(\Delta VR, \Delta VC)$--.
Column 5 Line 41: "$(\Delta NR, \Delta NC)$" should be --$(\Delta VR, \Delta VC)$--.

Signed and Sealed this
Twenty-first Day of May, 2019

Andrei Iancu
*Director of the United States Patent and Trademark Office*